(12) United States Patent
Chabinyc et al.

(10) Patent No.: US 7,361,529 B2
(45) Date of Patent: Apr. 22, 2008

(54) TRANSISTOR PRODUCTION USING SEMICONDUCTOR PRINTING FLUID

(75) Inventors: Michael L. Chabinyc, Burlingame, CA (US); Ana C. Arias, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 194 days.

(21) Appl. No.: 11/332,577

(22) Filed: Jan. 12, 2006

(65) Prior Publication Data

US 2006/0115945 A1 Jun. 1, 2006

Related U.S. Application Data

(62) Division of application No. 10/864,570, filed on Jun. 8, 2004, now Pat. No. 7,019,328.

(51) Int. Cl.
*H01L 21/00* (2006.01)

(52) U.S. Cl. .............................. 438/82; 438/22; 438/99; 257/40; 257/E21.114

(58) Field of Classification Search .................. 438/82, 438/99, 22; 257/40, E21.114
See application file for complete search history.

(56) References Cited

U.S. PATENT DOCUMENTS

| | | | |
|---|---|---|---|
| 4,690,715 A | 9/1987 | Allara et al. | |
| 6,335,539 B1 | 1/2002 | Dimitrakopoulos et al. | |
| 6,433,359 B1 | 8/2002 | Kelley et al. | |
| 6,569,707 B2 | 5/2003 | Dimitrakopoulos et al. | |
| 7,067,841 B2 * | 6/2006 | Parker | 257/40 |
| 2005/0236614 A1 | 10/2005 | Parker | |

OTHER PUBLICATIONS

Shimoda et al. "Inkjet Printing of Light-Emitting Polymer Displays", MRS Bulletin, Nov. 2003, pp. 821-827.

(Continued)

*Primary Examiner*—Andy Huynh
(74) *Attorney, Agent, or Firm*—Bever, Hoffman & Harms, LLP; Patrick T. Bever

(57) ABSTRACT

A transistor is formed by applying modifier coatings to source and drain contacts and/or to the channel region between those contacts. The modifier coatings are selected to adjust the surface energy pattern in the source/drain/channel region such that semiconductor printing fluid is not drawn away from the channel region. For example, the modifier coatings for the contacts can be selected to have substantially the same surface energy as the modifier coating for the channel region. Semiconductor printing fluid deposited on the channel region therefore settles in place (due to the lack of a surface energy differential) and forms a relatively thick active semiconductor region between the contacts. Alternatively, the modifier coatings can be selected to have lower surface energies than the modifier coating in the channel region, which actually causes semiconductor printing fluid to be drawn towards the channel region.

11 Claims, 12 Drawing Sheets

OTHER PUBLICATIONS

Salleo et al. "Polymer Thin-film Transistors with Chemically Modified Dielectric Interfaces", Applied Physics Letters, vol. 81, No. 23, Dec. 2, 2002, pp. 4383-4385.

Street et al. "Contact Effects in Polymer Transistors", Applied Physics Letters, vol. 81, No. 15, Oct. 7, 2002, pp. 2887-2889.

Bain et al. "Formation of Monolayer Films by the Spontaneous Assembly of Organic Thiols from Solution onto Gold", J. Am. Chem. Soc., 1989, pp. 321-335.

Wasserman et al. "Structure and Reactivity of Alkylsiloxane Monolayers Formed by Reaction of Alkyltrichlorosilanes on Silicon Substrates", Langmuir, 1989, American Chemical Society, pp. 1074-1087.

Burns et al.: "Inkjet Printing Of Ploymer Thin-Film Transistor Circuits", MRS Bulletin, Nov. 2003, pp. 829-834.

* cited by examiner

TRANSISTOR PRODUCTION USING SEMICONDUCTOR PRINTING FLUID

Further, this application is a divisional of U.S. patent application Ser. No. 10/864,570, entitled "Method Of Fabrication Of Printed Transistors" filed Jun. 8, 2004 now U.S. Pat. No. 7,019,328.

RELATED APPLICATIONS

This invention was made with Government support under 70NANBOH3033 awarded by NIST/ATP. The Government has certain rights in this invention.

BACKGROUND OF THE INVENTION

1. Field of the Invention

The invention relates generally to electronic materials processing, and more particularly to a system and method for printing thin film transistor arrays.

2. Related Art

Many modern devices, such as video and computer LCD (liquid crystal display) displays, include large arrays of thin film transistors (TFTs). These TFT arrays are commonly referred to as active matrix backplanes and are used to control the media in a display. As the demand for larger devices rises, the corresponding increase in TFT array sizes and interconnect complexities can render impractical the use of conventional chamber-based semiconductor process techniques (i.e., processes that are performed within a vacuum chamber).

Accordingly, alternative TFT production methods are taking on greater importance. A promising approach involves the printing of transistors using methods such as offset printing or jet printing. The use of such integrated circuit (IC) printing techniques can substantially lower transistor production costs, as well as increase manufacturing flexibility, as the substrate material and environmental limitations associated with chamber-based processing techniques can be eliminated.

For example, FIGS. 1A, 1B, and 1C depict a cross-sectional view of stages in a conventional IC printing operation. In FIG. 1A, a gate 130 formed on a substrate 110 is covered by a dielectric 120. A source contact 140 and a drain contact 150 on dielectric 120 define a channel region 101 above gate 130.

In FIG. 1B, a semiconductor printing fluid 160' is deposited into channel region 101, onto a surface 120-S of dielectric 120 and on to surfaces 140-S and 150-S of source contact 140 and drain contact 150, respectively. Semiconductor printing fluids are printable fluids that dry to leave a semiconductor material. Thus, printing fluid portion 160' dries into a semiconductor region 160 that forms the active region for a TFT 100, as shown in FIG. 1C.

Unfortunately, as indicated in FIG. 1C, the semiconductor region 160 in conventional printed TFT 100 typically exhibits a very "spread out" geometry, in which only a non-uniform layer of semiconductor material remains in channel region 101. These non-uniformities may comprise variations in thickness of, holes in, or discontinuities in the semiconducting layer. This in turn can lead to poor transistor performance or even device failure, if a discontinuity 160-B develops in semiconductor region 160.

This spreading of printing fluid portion 160' as it dries is due to the fact that dielectric 120 typically has a very different surface energy from source contact 140 and drain contact 150. Source contact 140 and drain contact 150 are typically formed from some type of metal, which makes them inherently wettable (high surface energy). However, to ensure proper crystalline structure within semiconductor region 160 for some printable semiconductors, it is typically required that surface 120-S of dielectric 120 (on which printing fluid portion 160' is deposited) be nonwettable (low surface energy).

This disparity in surface energies leads to the problematic spread geometry of semiconductor region 160 in FIG. 1C, as the relatively wettable surfaces 140-S and 150-S of contacts 140 and 150, respectively, tend to draw printing fluid portion 160' away from the relatively nonwettable surface 120-S in channel region 101. Conventional techniques for preventing this spread of semiconductor printing fluid 160' have typically involved constructing physical barriers at contacts 140 and 150 or by printing a large amount of excess material (i.e., depositing much more semiconductor printing fluid 160' than is necessary in an attempt to ensure that semiconductor region 160 is continuous in channel region 101). However, these approaches can add a great deal of cost and complexity to the printed transistor manufacturing process, and are therefore generally undesirable solutions.

Accordingly, it is desirable to provide a system and method for printing high-quality transistors that does not require the formation of physical containment structures on the transistors.

SUMMARY OF THE INVENTION

The invention is directed towards IC printing system and techniques that use semiconductor printing fluids to create semiconductor structures. By applying modifier coatings to the source/drain contacts and/or the channel region of a transistor, a semiconductor printing area is created that is conducive to the formation of relatively uniform, continuous active semiconductor regions in printed transistors.

A modifier coating is formed by applying a modifier fluid to a surface. The modifier molecules in the modifier fluid are selected to have an affinity for particular materials, and can be used to selectively coat transistor structures. A contact modifier coating can therefore be applied to just the source/drain contacts, while a channel modifier coating can be applied to the channel region between the contacts.

According to an embodiment of the invention, the contact and channel modifiers can be selected to have substantially similar surface energies. Therefore, a portion of semiconductor printing fluid dispensed onto the channel region will settle in place, rather than spread out away from the channel region as in conventional printed transistors. The resulting semiconductor region formed as the semiconductor printing fluid dries provides a continuous, relatively uniform active region that ensures proper transistor operation.

According to another embodiment of the invention, the contact modifier can be selected to have surface energy that is lower than the surface energy of the channel modifier. Therefore, a portion of semiconductor printing fluid dispensed onto the channel region will be drawn towards the channel region from the contact regions, thereby providing a degree of self-alignment for the semiconductor printing operation.

According to various other embodiments of the invention, modifier coatings can be applied to either the source/drain contacts or to the channel region. In either case, the modifiers can be selected to ensure a surface energy pattern between the contacts and channel region that ensures proper active region formation from semiconductor printing fluid dispensed onto the channel region.

The selective nature of the modifiers allows the modifier coatings to be created using a low-cost dip or spray process. According to an embodiment of the invention, a roll-processing system includes a coating module (system) for applying modifier coatings to the source/drain contacts and/or channel regions of circuits printed on a flexible substrate, in preparation for printing of semiconductor active regions. The ability to perform the coating operations using (non-chamber-based) dip or spray operations enables the entire IC printing operation to be on the flexible substrate straight from the roll (i.e., continuous processing).

BRIEF DESCRIPTION OF THE DRAWINGS

These and other features, aspects and advantages of the present invention will become better understood with regard to the following description, appended claims, and accompanying drawings, where:

DETAILED DESCRIPTION

By adjusting the surface characteristics of transistor elements, the quality and accuracy of printed semiconductor elements can be improved, thereby reducing the cost and improving the performance of printed transistors. For example, FIGS. 2A, 2B, 2C, 2D, and 2E depict cross-sectional views of a transistor formation process in accordance with an embodiment of the invention.

Figure 2A:
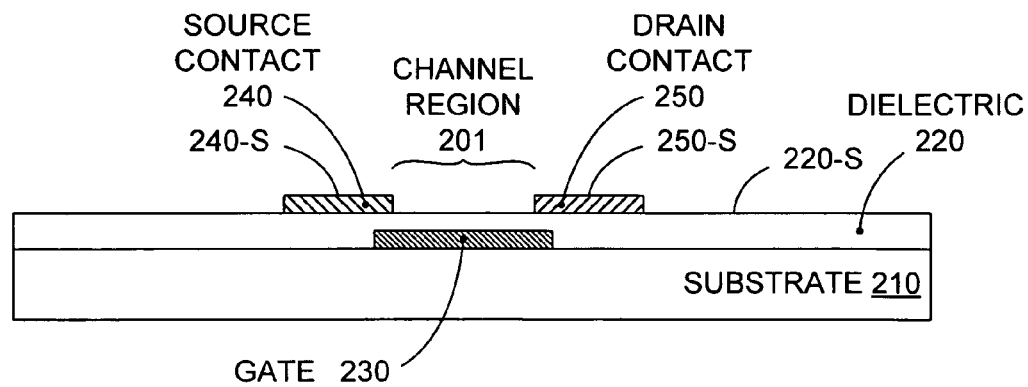
FIGS. 2A, 2B, 2C, 2D, and 2E are cross-sectional views of stages in a TFT printing operation in accordance with an embodiment of the invention.
Figure 2B:
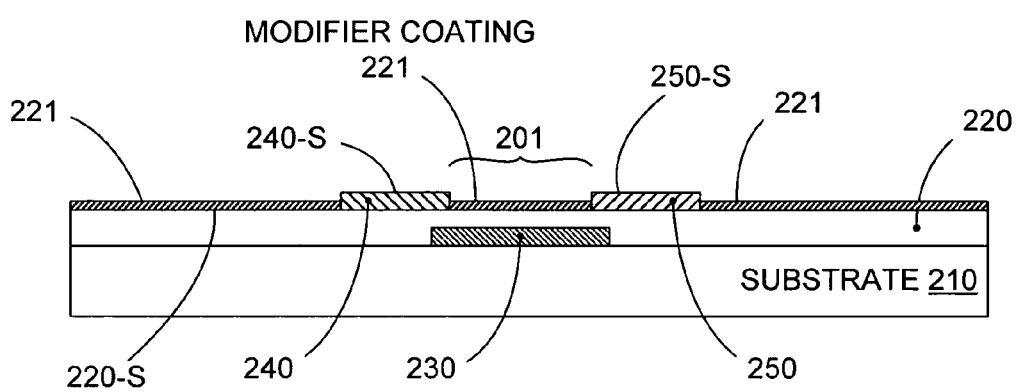

FIG. 2A depicts an intermediate stage in the formation of a printed transistor. A gate 230 is formed on a substrate 210, and is covered by a dielectric 220. A source contact 240 and a drain contact 250 (i.e., a contact pair) are formed on dielectric 220 and define a channel region 201 above gate 230. Gate 230, dielectric 220, and contacts 240 and 250 can be formed using any method, including conventional chamber-based processing techniques or IC printing techniques. Similarly, substrate 210 can comprise any substrate material, including a silicon wafer or a flexible plastic film.

As described above, surfaces 240-S and 250-S of contacts 240 and 250, respectively, will typically exhibit a surface energy that is different than the surface energy of a surface 220-S of dielectric 220. For example, contacts 240 and 250 will typically be a metal such as aluminum, copper, or gold (or sometimes even doped polysilicon) that exhibits wettable surfaces 240-S and 250-S, respectively, while dielectric 220 will typically be an inorganic oxide or insulating polymer having a lower surface energy than that of the contacts 240 and 250.

Figure 1A:
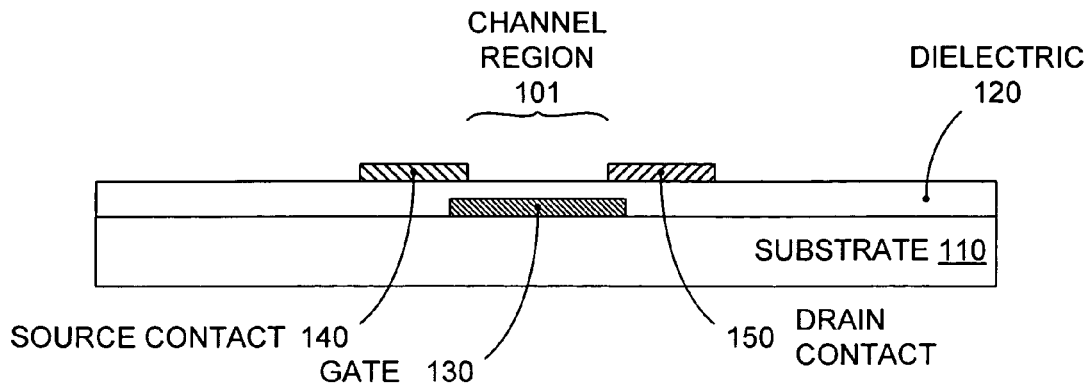
FIGS. 1A, 1B, and 1C, are cross-sectional views of stages in a conventional TFT printing operation.
Figure 1B:
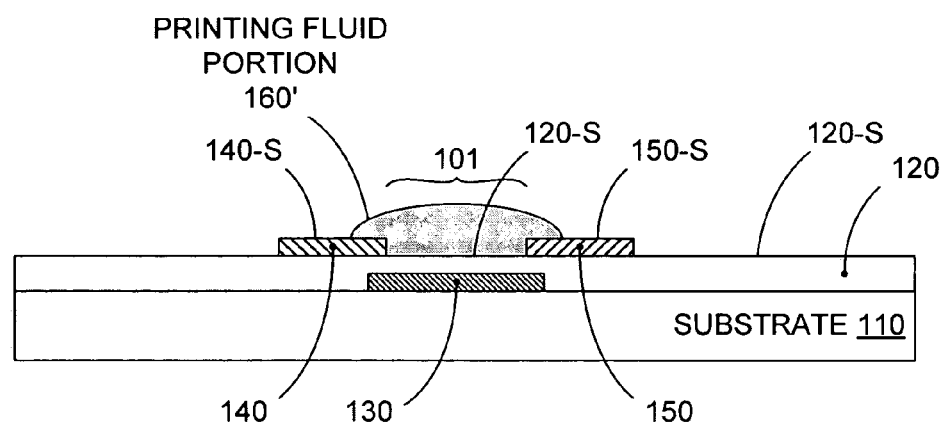
Figure 1C:
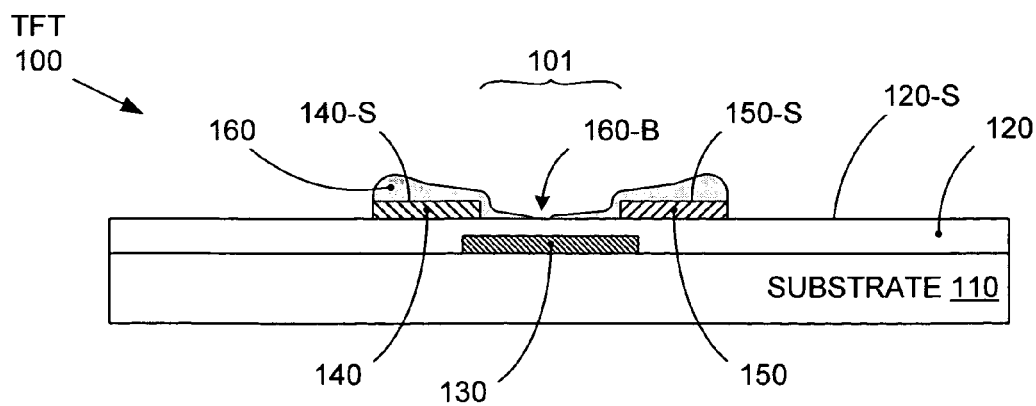

As described above with respect to FIGS. 1A-1C, this typical surface energy distribution across the source/drain contacts and channel region of a TFT is far from ideal for subsequent semiconductor printing operations. According to various embodiments of the invention, one or more modifier coatings (described in greater detail below with respect to FIGS. 2B and 2C) can be used to overcome this disadvantageous surface energy pattern.

A modifier contains a chemical moiety (component) that is reactive towards the surface being coated. By using modifiers that are only reactive towards the surfaces for which coverage is desired, selective coverage of a heterogeneous surface can be readily achieved. For example, by applying a modifier fluid (i.e., a fluid containing modifier molecules or compounds) that is reactive towards dielectric 220 but non-reactive towards contacts 240 and 250 (e.g., an alkyl trichlorosilane or alkyl trimethoxysilane if dielectric 220 is a silicon oxide and contacts 240 and 250 are metals), modifier coating 221 can be formed over only surface 220-S of dielectric 220 using a simple dip or spray process. Note however, that the formation modifier coating 221 (and any other modifier coating described herein) can be formed using a variety of different techniques, including vapor deposition or even direct printing.

According to an embodiment of the invention, modifier coating 221 can comprise a monolayer of molecules, sometimes referred to as a self-assembled monolayer (SAM). The SAM could be formed by dissolving the desired modifier molecule (e.g., alkyl trichlorosilane) in a solvent (e.g., hexadecane or toluene), and then dipping substrate 210 (and the overlying structures) into the solvent (e.g., in a bath or spray). The modifier molecules then assemble onto exposed surfaces of dielectric 220 to form modifier coating 221. Because the modifier molecules are non-reactive towards contacts 240 and 250, no coating is formed on those structures.

Figure 2C:
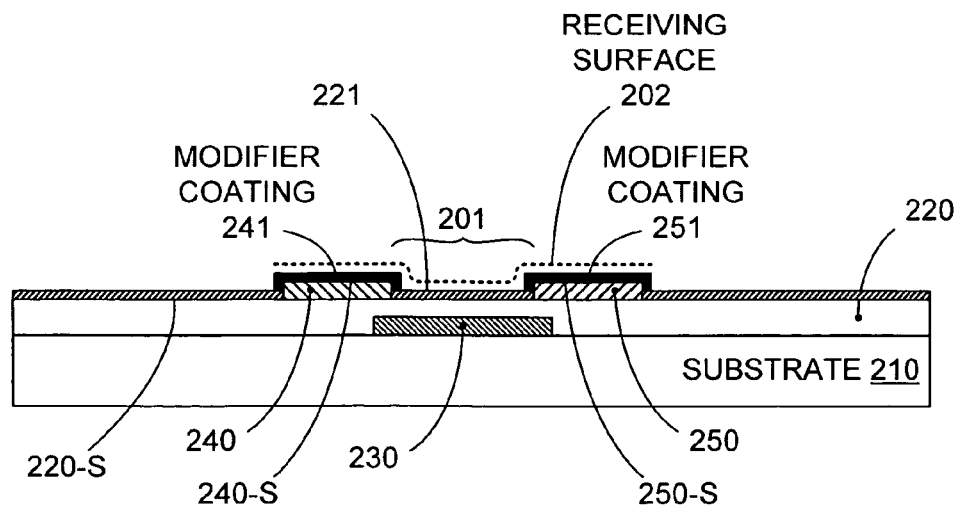

Similarly, modifier coatings 241 and 251 can be formed on surfaces 240-S and 250-S, respectively, of contacts 240 and 250, respectively, as shown in FIG. 2C. Once again, by selecting a modifier material that is reactive towards the material of contacts 240 and 250 (e.g., an organothiol if contacts 240 and 250 are coinage metals, such as palladium or gold), but non-reactive towards modifier coating 221, surfaces 240-S and 250-S of contacts 240 and 250 can be selectively coated. In this manner, a receiving surface 202 (the extent of which is indicated by the dotted line) is created on which semiconductor printing fluid can subsequently be deposited.

Note that because of the selective nature of modifier coatings 221, 241, and 251, the order in which those coatings are formed can be varied. For example, according to another embodiment of the invention, modifier coatings 241 and 251 can be formed over surfaces 240-S and 250-S, respectively, of contacts 240 and 250, respectively, prior to the formation of modifier coating 221 over surface 220-S of dielectric 220. Note also that since dielectric 220 is generally formed from a different material than contacts 240 and 250, modifier coating 221 will generally also be different from modifier coatings 241 and 251 (which themselves may be different if contacts 240 and 250 are formed from different materials).

According to an embodiment of the invention, modifier coatings 241 and 251 can be monolayers, thereby minimizing the effect of coatings 241 and 251 on the electrical properties of contacts 240 and 250, respectively. Because monolayers are only a single molecule thick, electrical signals can pass through them without significant degradation or attenuation.

The use of modifier coatings 221, 241, and 251 allows the surface characteristics of receiving surface 202 at channel region 201 and over source contact 240 and drain contact 250 to be set to desired values. Specifically, the surface energy of receiving surface 202 at each location can be adjusted to provide a desired surface energy pattern for the printing of a semiconductor region.

Figure 2D:
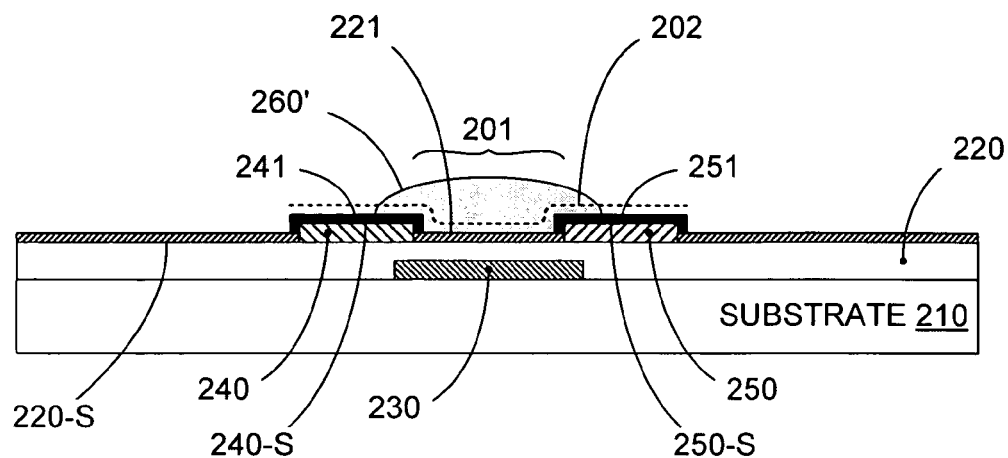

For example, according to an embodiment of the invention, modifier coatings 221, 241, and 251 could be selected to have substantially the same surface energy characteristics. Then, a semiconductor printing fluid 260' deposited onto receiving surface 202 as shown in FIG. 2D (for example, via jet printing) would spread out mainly in response to its own surface tension. Note that while semiconductor printing fluid 260' is depicted as extending from contact 240 to contact 250 (across channel region 201) for exemplary purposes, according to various other embodiments of the invention, semiconductor printing fluid 260' may be deposited onto receiving surface 202 over only channel region 201 or over channel region 201 and one of contacts 240 and 250 (with semiconductor printing fluid 260' extending to both contacts 240 and 250 during the drying process).

Semiconductor printing fluid 260' can comprise any semiconductor material in a carrier liquid, and can be a suspension, dispersion, solution, or any other liquid form. Examples of semiconductor printing fluids include, but are not limited to, semiconducting polymers such as poly(3-hexylthiophene), P3HT, or poly[5,5'-bis(3-dodecyl-2-thienyl)-2,2'-bithiophene], PQT-12 dissolved in an organic solvent (e.g. chlorobenzene). Dispersions of inorganic semiconducting nanoparticles or colloids are another example of a semiconductor printing fluid. Because the dissimilar surface energies of dielectric 220 and contacts 240 and 250 are "hidden" by modifier coatings 221, 241, and 251, printing fluid 260' is not pulled away from channel region 201.

Figure 2E:
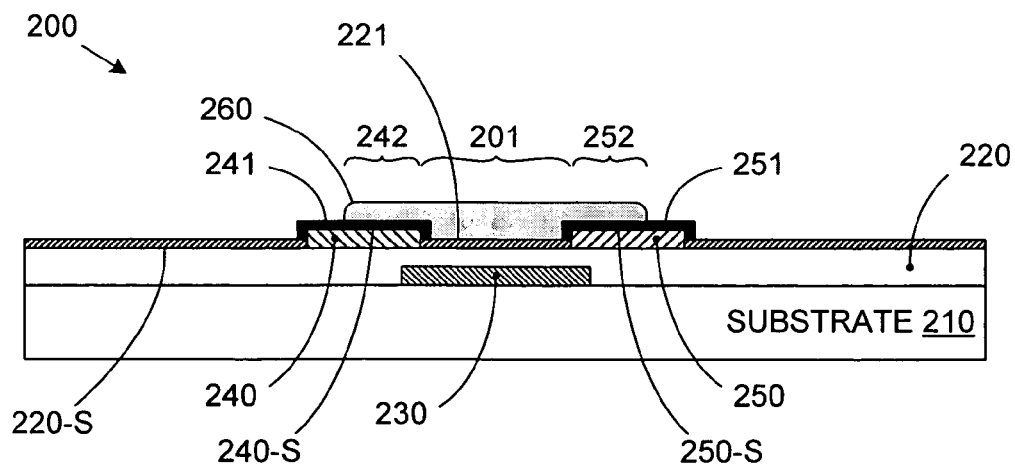

Thus, as shown in FIG. 2E, printing fluid 260' is able to settle in place (in response to any internal surface tension) and dry into a semiconductor active region 260 that provides a continuous layer of semiconductor material that is relatively uniform across channel region 201 (i.e., semiconductor active region 260 is at least as thick or thicker over channel region 201 than it is over contacts 240 and 250). This allows the final TFT 200 to provide reliable transistor operation. Note that active semiconductor region 260 also spreads out over portions 242 and 252 of modifier coatings 242 and 252, respectively, thereby ensuring good electrical contact with contacts 240 and 250, respectively. In some embodiments, the active semiconductor region 260 may only be in contact with the edge of modifier coatings 242 and 252 on contacts 240 and 250 respectively.

According to another embodiment of the invention, modifier coatings 241 and 251 formed on contacts 240 and 250, respectively, could be selected to have lower surface energies than modifier coating 221 formed over dielectric 220. As a result, the portions of receiving surface 202 over contacts 240 and 250 are more nonwettable than the portion of receiving surface 202 in channel region 201.

Figure 2F:
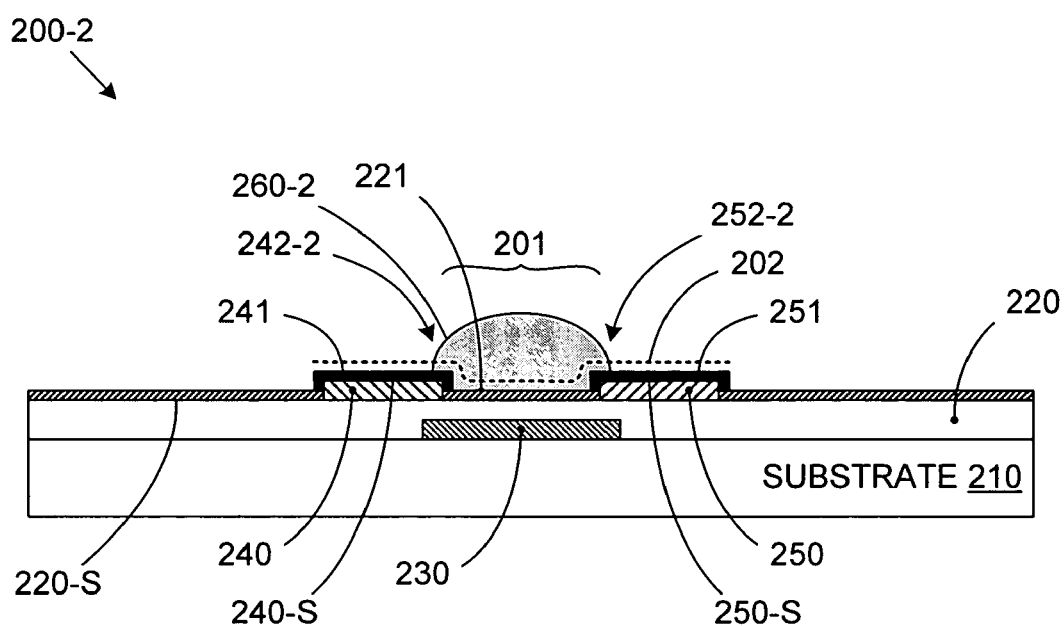
FIGS. 2F, 2G, and 2H are cross-sectional views of printed TFT in accordance with various other embodiments of the invention.

Therefore, a semiconductor printing fluid 260' deposited over channel region 201 and contacts 240 and 250 tends to settle and dry mainly over channel region 201, forming a well-defined, relatively uniform active region 260-2 for a TFT 200-2, as shown in FIG. 2F. Note that a semiconductor region 260-2 formed in this manner will tend to cover smaller portions 242-2 and 252-2 of modifier coatings 241 and 251, respectively, than a semiconductor region (260 in FIG. 2E) formed over a relatively homogeneous surface energy distribution. However, transistor 200-2 will generally function properly with very small active region interfaces (242-2 and 252-2), since even those small active region interfaces can provide the necessary electrical contact with contacts 240 and 250, so long as a substantial active semiconductor region 260 (i.e., providing sufficient charge carriers) is provided across channel region 201. The act of depositing the semiconductor printing fluid (260') onto channel region 201 can automatically create some contact between semiconductor region 260 and contacts 240 and 250, if the minimum drop size of IC printing systems is larger than the desired channel length.

In this manner, modifier coatings 221, 241, and 251 can be used to provide self-alignment capability for semiconductor printing operations. Note that while forming modifier coatings over both dielectric 220 and contacts 240 and 250 provides the greatest flexibility in defining a surface energy pattern, according to various other embodiments of the invention, modifier coatings can be formed over just contacts 240 and 250, or over just dielectric 220.

Figure 2G:
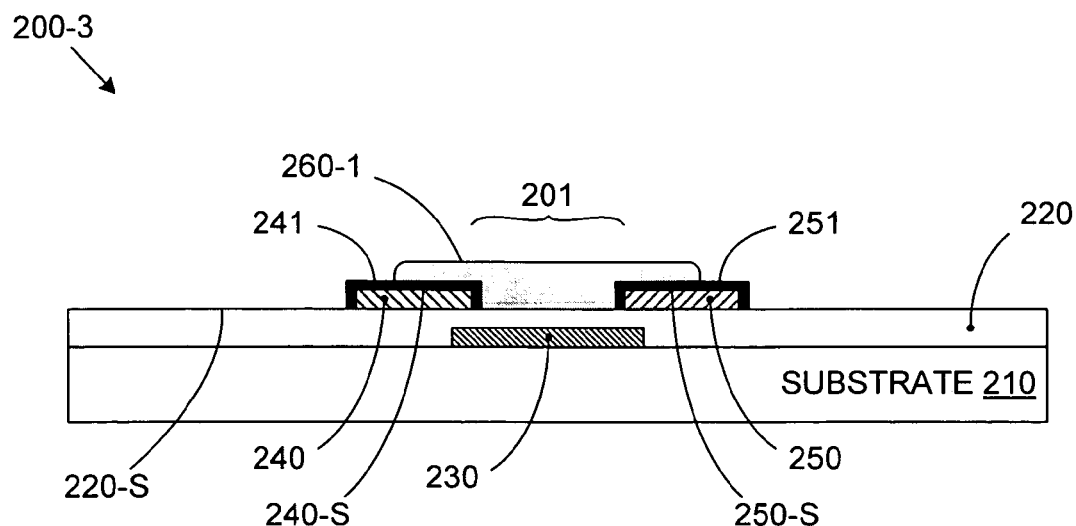

For example, FIG. 2G shows a TFT 200-3 that is substantially similar to TFT 200 shown in FIG. 2E, except that a modifier coating has not been formed over dielectric 220. By selecting modifier coatings 241 and 251 to be as nonwettable as dielectric 220, a receiving surface formed by modifier coating 241, the portion of dielectric 220 in channel region 201, and modifier coating 251 provides a surface energy pattern that allows a semiconductor active region 260-1 to be printed that provides a relatively thick semiconductor layer across channel region 201 (for reasons substantially similar to those described with respect to FIG. 2E). According to another embodiment of the invention, modifier coatings 241 and 251 could be selected to be more nonwettable than dielectric 220, thereby creating a receiving surface that provides the self-aligning aspect for semiconductor active region 260-1 described with respect to FIG. 2F.

Figure 2H:
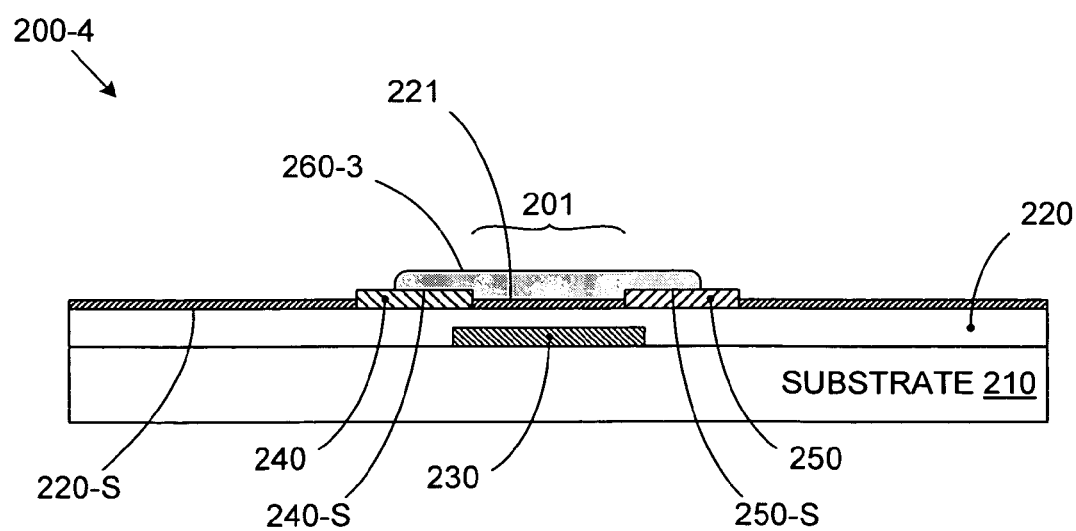

Alternatively, FIG. 2H shows a TFT 200-4 that is substantially similar to TFT 200 shown in FIG. 2E, except that modifier coatings have not been formed over contacts 240 and 250. By selecting modifier coating 221 to be as wettable as contacts 240 and 250, a receiving surface formed by source 240, the portion of modifier coating 221 in channel region 201, and drain 250 provides a surface energy pattern that allows a semiconductor active region 260-2 to be printed that provides a relatively uniform, continuous semiconductor layer across channel region 201 (for reasons substantially similar to those described with respect to FIG. 2E). According to another embodiment of the invention, modifier coating 221 could be selected to be more wettable than contacts 240 and 250, thereby creating a receiving surface that provides the self-aligning aspect for semiconductor active region 260-1 described with respect to FIG. 2F (note that the material used to form semiconductor active region 260-1 would then need to be selected to provide proper crystalline structure when deposited on a wettable modifier coating 221).

Figure 2I:
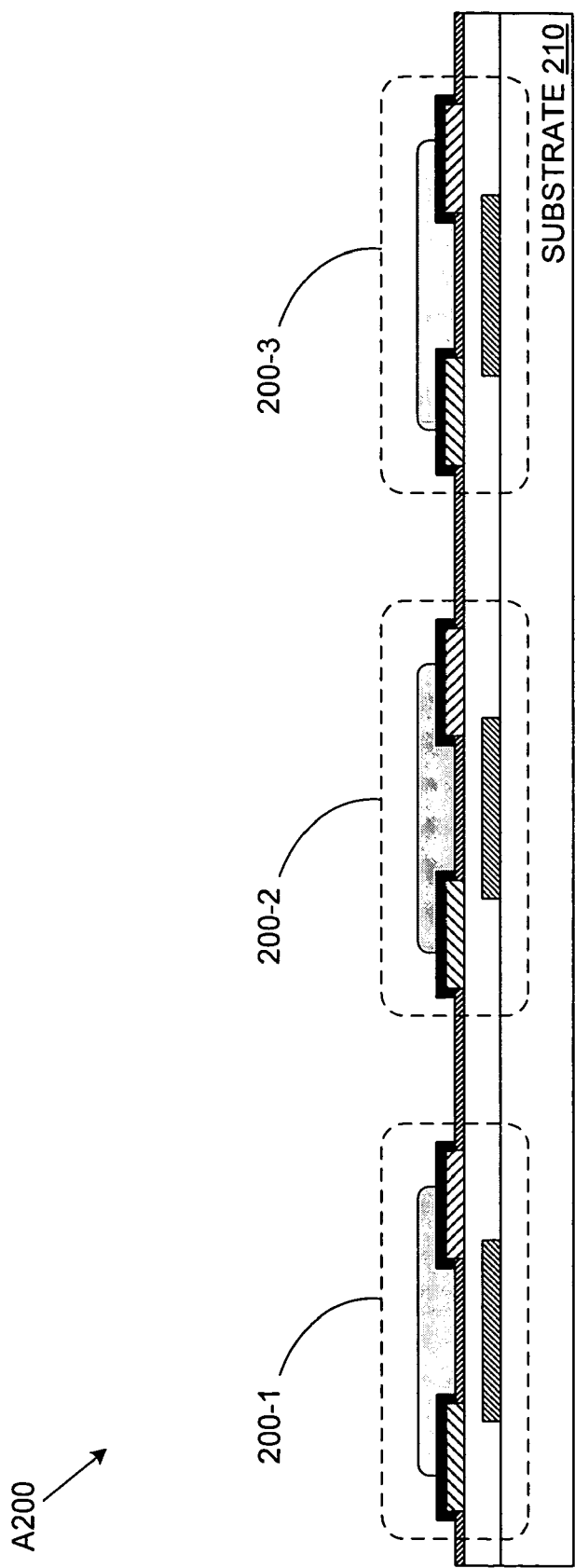
FIG. 2I is a cross-sectional view of a printed TFT array in accordance with an embodiment of the invention.

According to another embodiment of the invention, printed transistors with modifier coatings can be used to form a transistor array. FIG. 2I shows a cross-sectional view of a transistor array A200 (e.g., a TFT array suitable for a display backplane) that includes transistors 200-1, 200-2, and 200-3, each of which is substantially similar to transistor 200 shown in FIG. 2E. Note that a transistor array in accordance with the invention can include any number and arrangement of transistors. Note further that while transistors 200-1, 200-2, and 200-3 are depicted as being substantially similar to transistor 200 for exemplary purposes, according to various other embodiments of the invention, transistors 200-1, 200-2, and 200-3 can comprise any transistor structure that includes modifier coatings for surface energy patterning (e.g., transistors 200-2, 200-3, and 200-4 shown in FIGS. 2F, 2G, and 2H, respectively).

Figure 3:
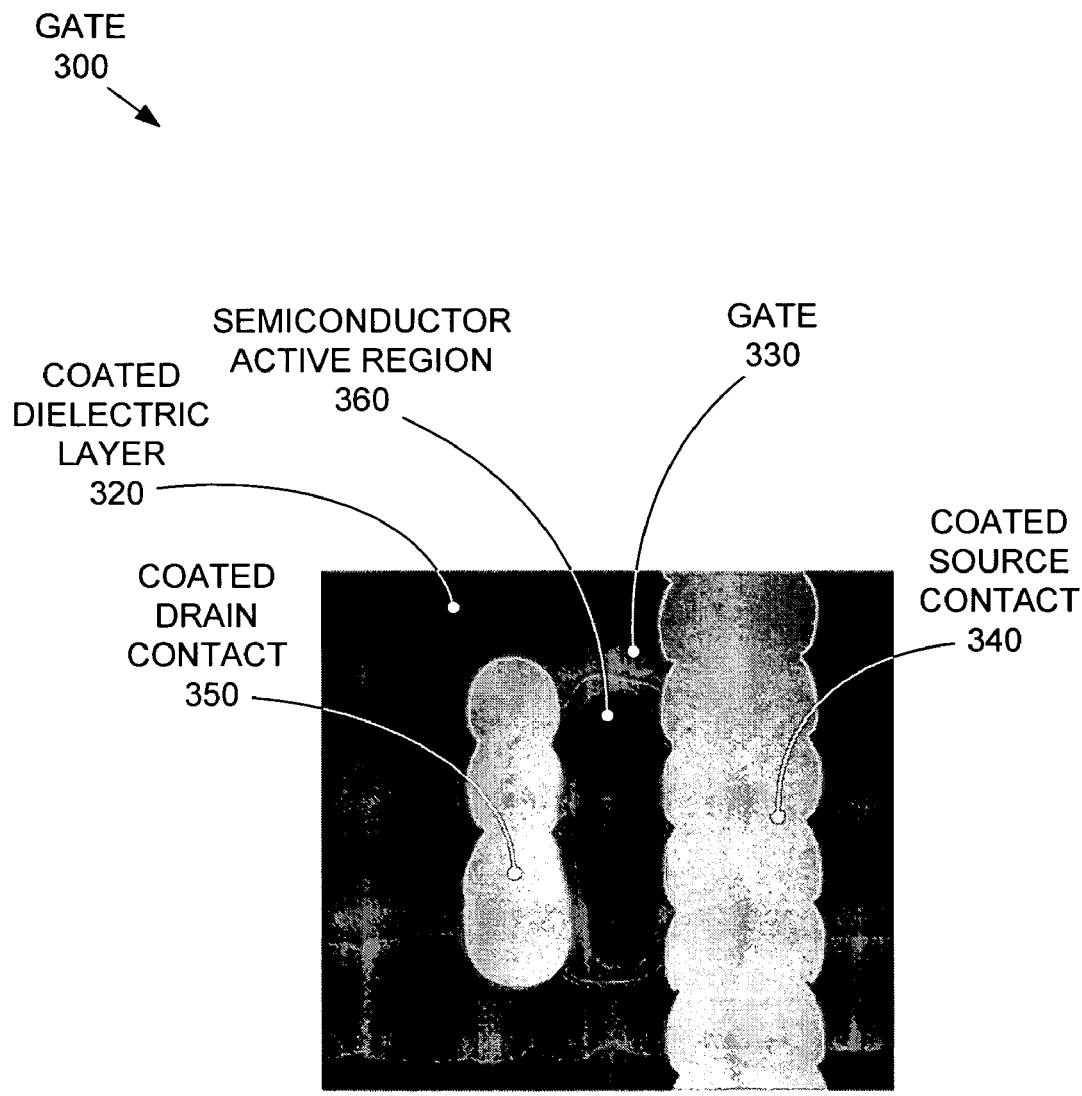
FIG. 3 is a top view of a printed TFT in accordance with an embodiment of the invention.

FIG. 3 is a micrograph of a top view of a TFT 300 in accordance with an embodiment of the invention. TFT 300 is substantially similar to TFT 200-1 shown in FIG. 2F, and includes a coated dielectric layer 320 formed over a gate 330, a coated source contact 340 and a coated drain contact 350 formed on coated dielectric layer 320, and a semiconductor active region 360 formed over gate 330 between contacts 340 and 350. Note that for exemplary purposes, the micrograph of FIG. 3 shows all the TFT structures, including gate 330, which is actually covered by coated dielectric layer 320.

Coated dielectric layer 320 includes a dielectric material and a first modifier coating (as described with respect to FIG. 2B), while contacts 340 and 350 are metal contacts coated with a second (different) modifier coating (as described with respect to FIG. 2C). Note that coated source contact 340 and coated drain contact 350 are actually formed on uncoated portions of coated dielectric layer 320, since contacts 340 and 350 are formed before dielectric layer 320 is coated.

The modifier coating of coated source contact 340 and coated drain contact 350 is selected to be more nonwettable than the modifier coating of coated dielectric layer 320. Therefore, a drop of semiconductor printing fluid deposited over gate 330 and contacts 340 and 350 will tend to flow towards the channel region between contacts 340 and 350 (for reasons described with respect to FIG. 2F), thereby causing semiconductor active region 360 to be aligned with gate 330.

Note that while a particular TFT structure is described in FIGS. 2A-2H for exemplary purposes, the use of modifiers to adjust surface energy patterns for IC printing operations can be applied to any transistor structure where control over printed semiconductor elements is important. For example, FIGS. 4A, 4B, 4C, 4D, 4E, 4F, and 4G depict cross-sectional views of a transistor formation process in accordance with another embodiment of the invention.

Figure 4A:
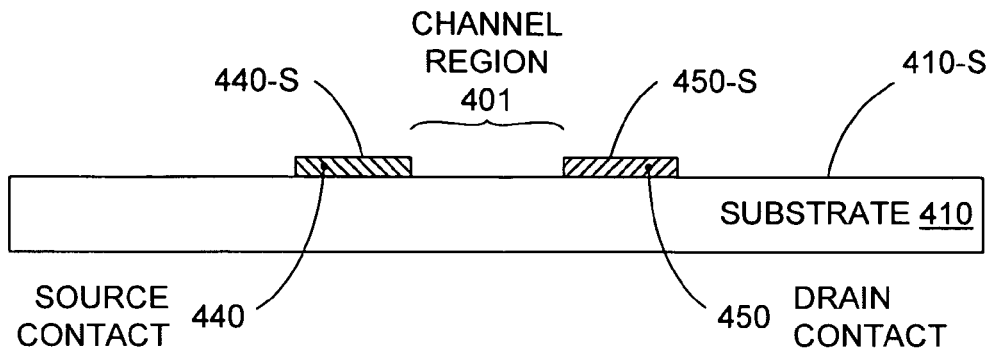
FIGS. 4A, 4B, 4C, 4D, 4E, 4F, and 4G are cross-sectional views of stages in a TFT printing operation in accordance with another embodiment of the invention.
Figure 4B:
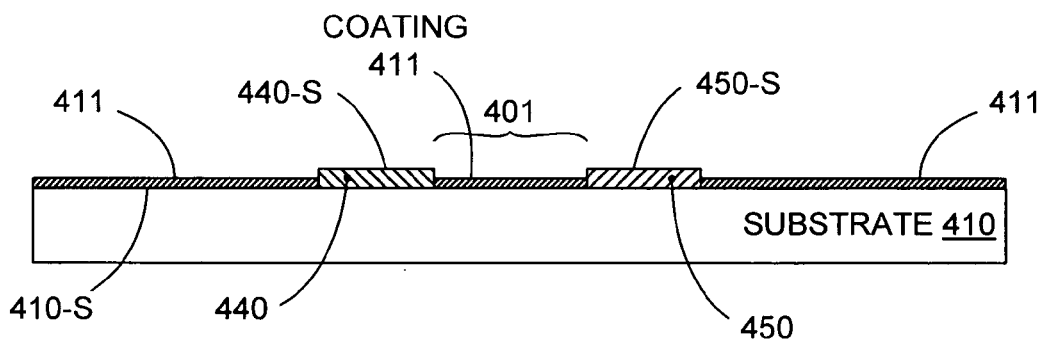

FIG. 4A shows a cross-section of a source contact 440 and a drain contact 450 formed on a substrate 410, with source contact 440 and drain contact 450 defining a channel region 401. A modifier coating 411 is formed over a surface 410-S of substrate 410 in FIG. 4B. Modifier coating 411 is selected to be reactive only with substrate 410, so that surfaces 440-S and 450-S of contacts 440 and 450, respectively, are left uncoated. According to an embodiment of the invention, modifier coating 411 is selected to be relatively nonwettable towards the semiconductor printing fluid (shown in FIG. 4D) to ensure high-quality printed semiconductor formation.

Figure 4C:
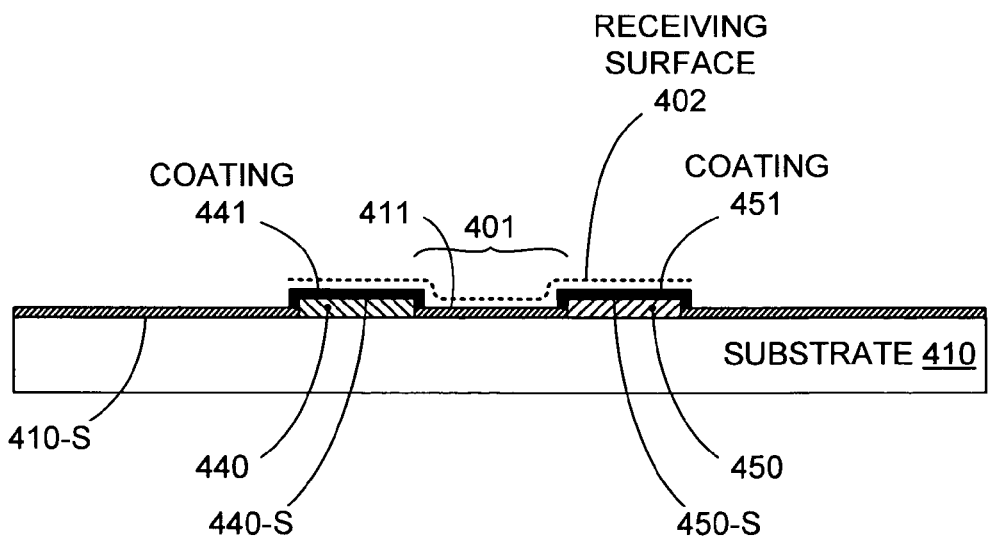

Next, in FIG. 4C, modifier coatings 441 and 451 are formed over surfaces 440-S and 450-S, respectively, of contacts 440 and 450, respectively. Modifier coatings 441 and 451 (which can be formed using the same modifier fluid) are selected to be reactive only with contacts 440 and 450, and so can be applied using a dip or spray process. Just as described with respect to FIGS. 2B and 2C, the selective nature of modifier coatings 411, 441, and 451 allows those coatings to be formed in any order. Note also that according to an embodiment of the invention, modifier coatings 441 and 451 can comprise SAMs to minimize the electrical effects of modifier coatings 441 and 451. In this manner, a receiving surface 402 (the extent of which is indicated by the dotted line) is created on which semiconductor printing fluid can subsequently be deposited.

Figure 4D:
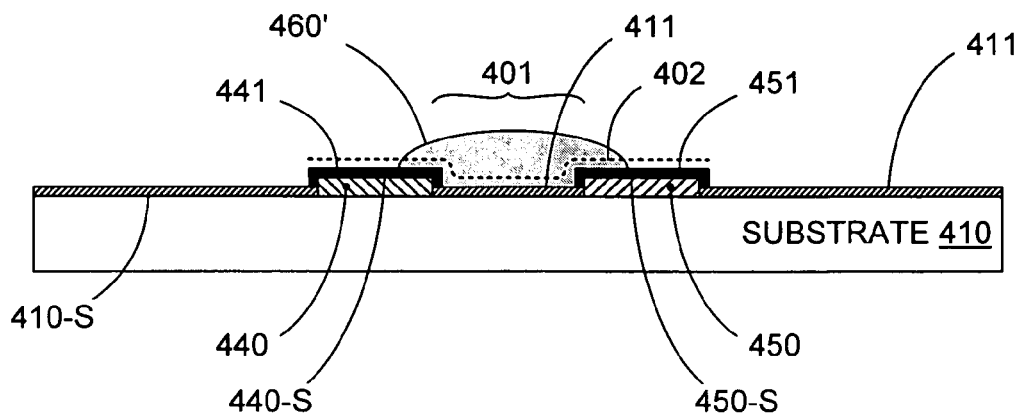

According to various embodiments of the invention, modifier coatings 411, 441, and 451 can also be selected to have substantially similar surface energies, or can be selected such that modifier coating 411 has a greater surface energy than coatings 441 and 451 (i.e., modifier coatings 441 and 451 are more nonwettable than modifier coating 411). Thus, a semiconductor printing fluid 460' deposited over receiving surface 402 as shown in FIG. 4D, will either settle in place (homogenous surface energy pattern) or will be drawn substantially into channel region 401 (modifier coatings 441 and 451 being more nonwettable than modifier coating 411). In either case, a relatively thick active semiconductor region 460 is formed over channel region 401, as shown in FIG. 4E.

Figure 4E:
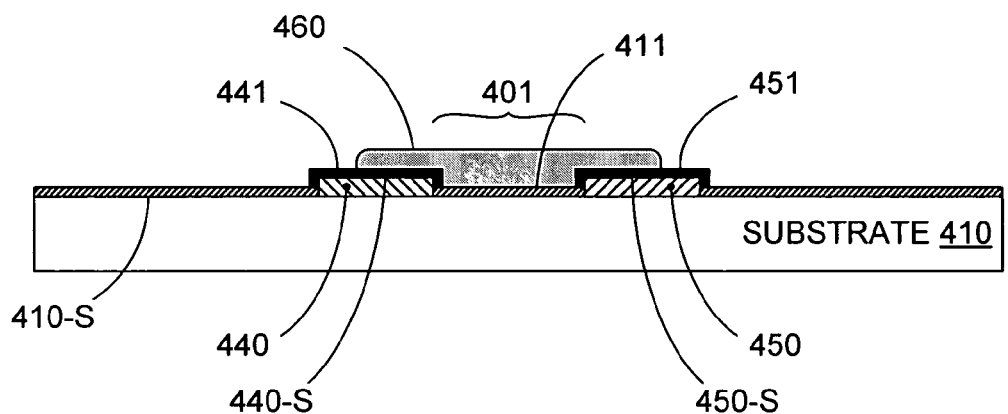
Figure 4F:
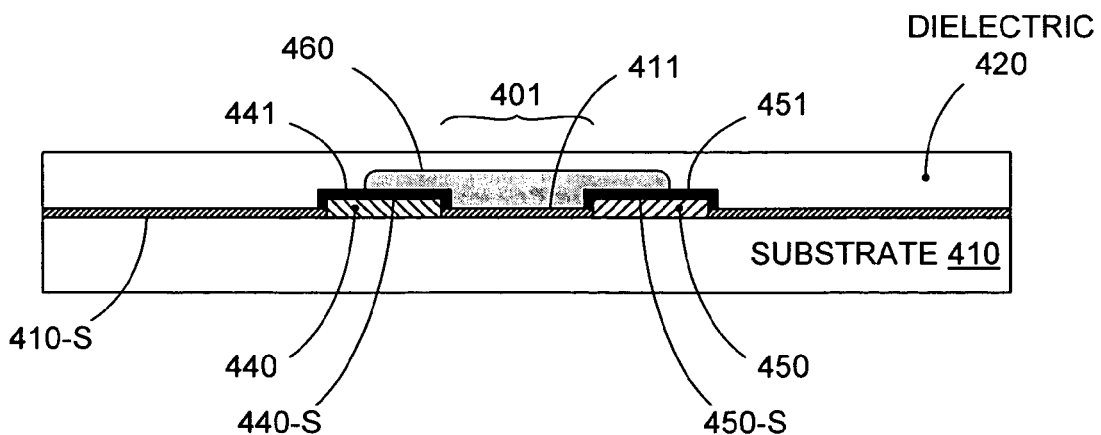
Figure 4G:
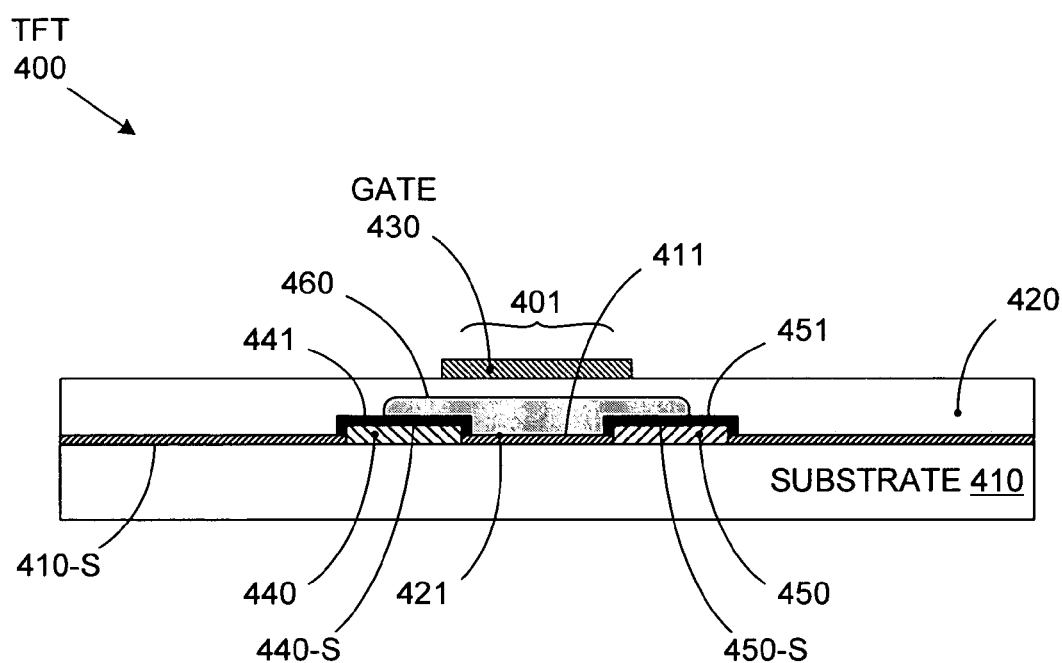

Then, in FIG. 4F, a dielectric 420 is formed over the structure shown in FIG. 4E. Finally, a gate contact 430 is formed on dielectric 420 over channel region 401 to complete TFT 400, as shown in FIG. 4G. In this manner, a high-quality transistor can be produced using a semiconductor printing fluid. Note that according to an embodiment of the invention, source contact 440, drain contact 450, and gate contact 430 can all be formed using IC printing techniques, thereby allowing TFT 400 to be produced without any chamber-based process steps.

Figure 5:
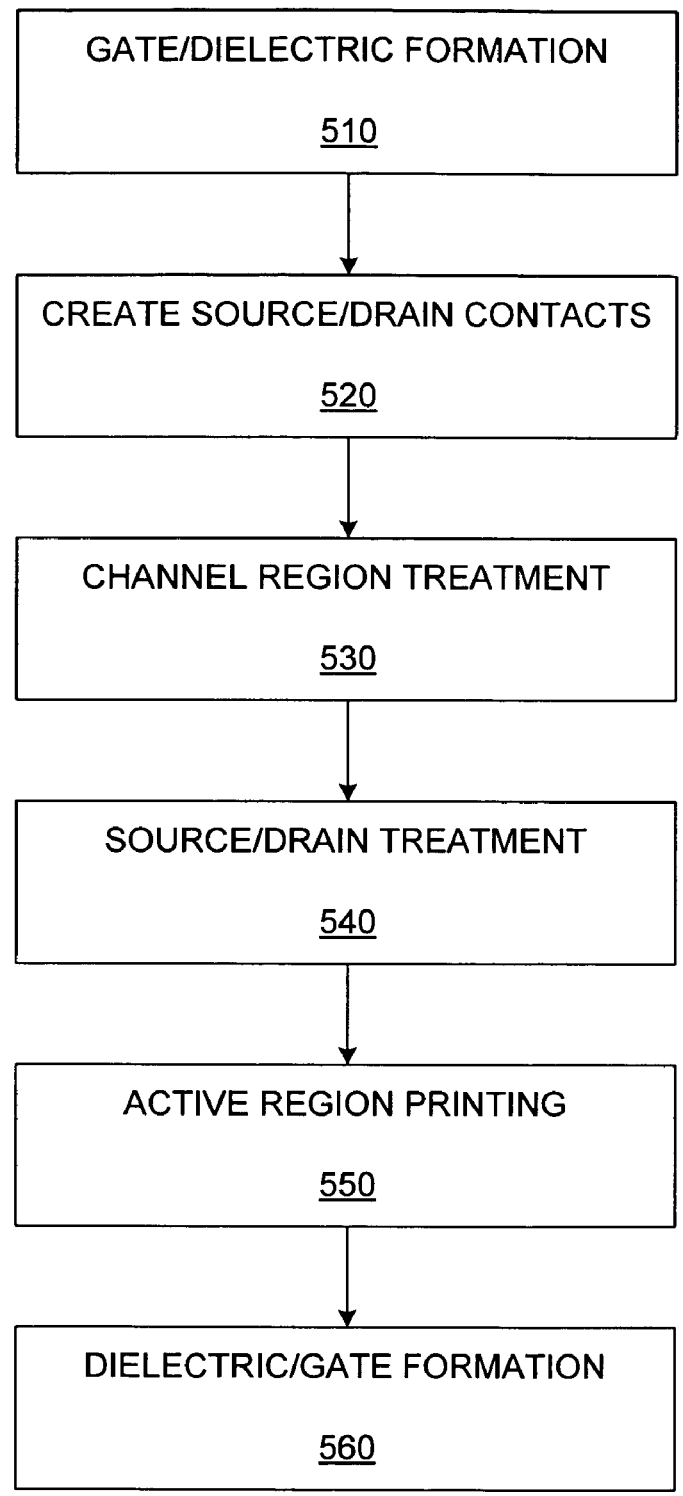
FIG. 5 is a flow diagram of an IC printing operation in accordance with an embodiment of the invention.

FIG. 5 shows a flow diagram for the transistor formation processes described with respect to FIGS. 2A-2H and 4A-4G, according to an embodiment of the invention. If a transistor similar to TFT 200 shown in FIG. 2E is being formed, in an optional "GATE/DIELECTRIC FORMATION" block 510, a dielectric layer (220) is formed over a gate contact (230) on a substrate (210). A source contact (240) and a drain contact (250) are then formed on the dielectric layer to define a channel region (201) over the gate contact in a "CREATE SOURCE/DRAIN CONTACTS" block 520. According to an embodiment of the invention, the source, drain, and gate contacts can be formed using IC printing techniques.

Alternatively, if a transistor similar to TFT 400 shown in FIG. 4G is being formed, optional block 510 is not executed, and in block 520, a source contact (440) and a drain contact (450) are formed on a substrate (410) to define a channel region (401). Once again, according to an embodiment of the invention, the source and drain contacts can be formed using IC printing techniques.

In either case (i.e., block 510 executed or not executed), after the contact formation in block 520, the channel region and/or the contacts are coated with modifiers selected to provide a desired surface energy pattern for subsequent semiconductor printing fluid deposition. According to an embodiment of the invention, a first modifier coating (221 or 411) is applied to the channel region (and other exposed portions of the dielectric or substrate) in a "CHANNEL REGION TREATMENT" block 530, and a second modifier coating (241/251 or 441/451) is applied to the source and drain contacts in a "SOUCE/DRAIN TREATMENT" block 540.

As described above, because of the selective nature of modifier coatings, blocks 530 and 540 can be performed in any order (or even simultaneously, if modifiers having the appropriate reactivities are selected). According to an embodiment of the invention, the modifier coatings formed over the source and drain contacts in block 540 can be monolayers to minimize the effect of the modifier coatings on electrical connectivity.

The channel region and source/drain contact modifier coatings are selected to provide a surface energy pattern that is conducive to proper active region formation, as described above with respect to FIGS. 2C-2F and FIGS. 4C-4E. Thus, when a semiconductor printing fluid (260' or 460') is deposited over the channel region in an "ACTIVE REGION PRINTING" block 550, the fluid is not drawn away from the channel region and can dry to provide a relatively thick, continuous semiconductor structure (260 or 460) at the channel region.

At this point, the process for creating a transistor similar to TFT 200 shown in FIG. 2E would be substantially complete. However, if a transistor similar to TFT 400 shown in FIG. 4G is being formed, an optional "DIELECTRIC/GATE FORMATION" block 560 is executed to cover the active semiconductor structure with a dielectric layer and form a gate contact (430) over the channel region.

Note that according to another embodiment of the invention, either block 530 or block 540 could be skipped, so that only the source/drain contacts or the layer on which the source/drain contacts are formed (e.g., the dielectric layer or the substrate) receive a modifier coating (as described with respect to FIGS. 2G and 2H). Note further that since none of the blocks in the flow diagram of FIG. 5 require chamber-based processing, the method of the flow diagram can be used in continuous roll-type processing systems.

Figure 6:
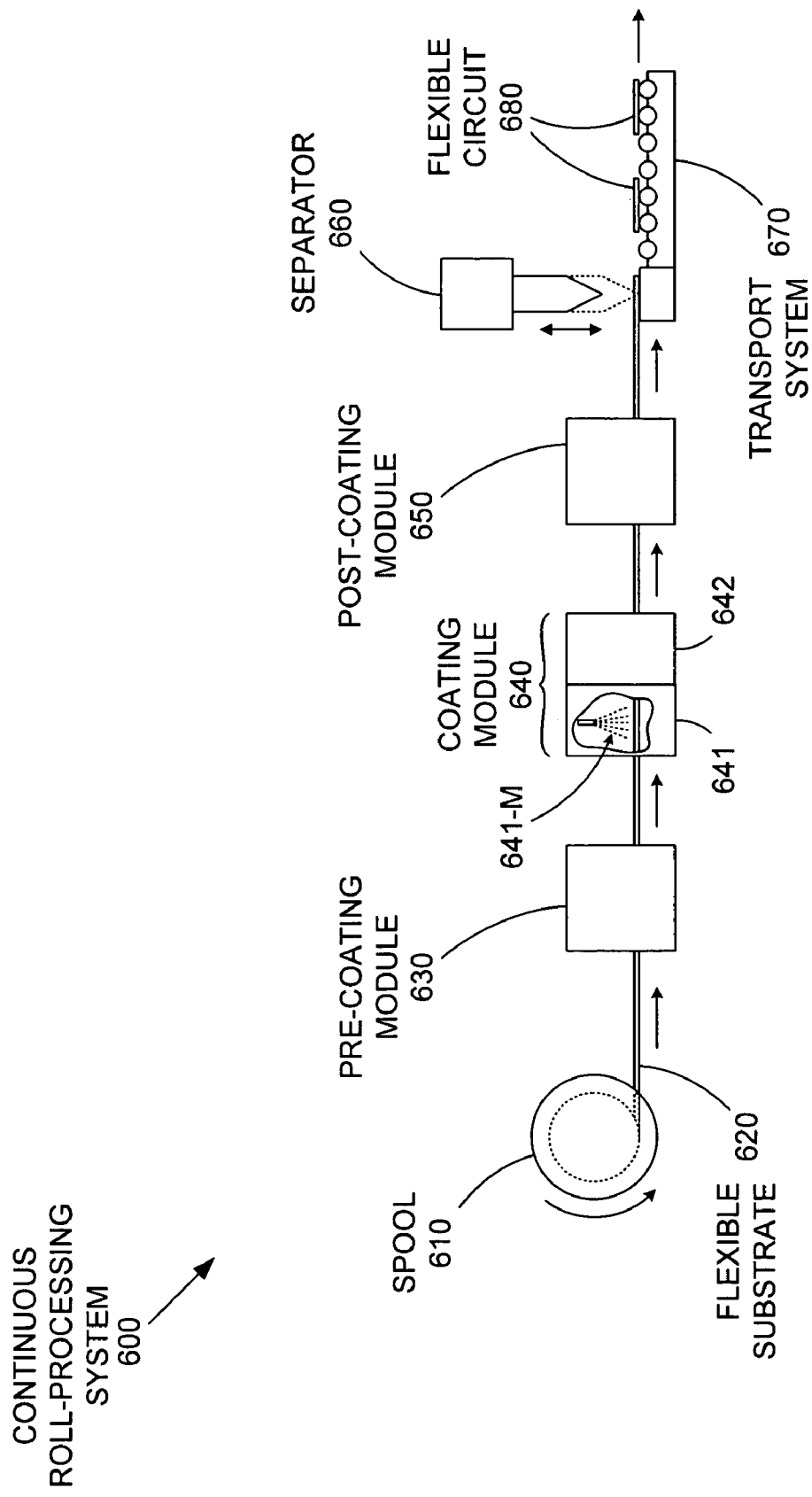
FIG. 6 is a diagram of an IC printing system in accordance with an embodiment of the invention.

For example, FIG. 6 shows a schematic diagram of a continuous roll-processing system 600, in accordance with an embodiment of the invention. System 600 includes a spool 610 on which is wound a roll of flexible substrate 620, a pre-coating module 630, a coating module 640, a post-coating module 650, a separator 660, and a transport system 670. Examples of flexible substrates include, but are not limited to, thin glass sheets, mylar, polyimide, or polyethylene naphthalate (PEN).

During operation of system 600, flexible substrate 620 is unwound from spool 610 into pre-coating module 630, where contact pairs (i.e., source/drain contacts) and any underlying transistor structures are created on flexible substrate 620. For example, as shown in FIG. 2A, a gate contact (230) and dielectric layer (220) could be formed under the source/drain contacts (240 and 250). Alternatively, as shown in FIG. 4A, the source/drain contacts (440 and 450) could be formed directly on flexible substrate 620. Note that pre-coating module 630 (as well as coating module 640 and post-coating module 650) can include any number of sub-modules to perform a desired set of processing operations).

Flexible substrate 620 continues into coating module 640, where one or more modifier coatings are applied. According to an embodiment of the invention, coating module 640 can include two submodules 641 and 642 for applying different modifier coatings to the source/drain contacts and to the layer on which the source/drain contacts are formed (e.g., dielectric layer or substrate), as described with respect to FIGS. 2B-2C and FIGS. 4B-4C. According to another embodiment of the invention, coating module 640 can apply a modifier coating to either source/drain contacts or the underlying layer, as described with respect to FIGS. 2G and 2H.

As described above, the selective nature of the modifier coating(s) allows coating module 640 to be implemented as a dip or spray apparatus, which is well-suited for use in continuous roll-processing system 600. For example, as depicted in the cutaway of coating submodule 641, a modifier fluid 641-M could simply be sprayed onto flexible substrate 620 to form a modifier coating on the structures on flexible substrate 620 that are reactive with modifier fluid 641-M. According to an embodiment of the invention, coating module 640 can create SAMs over desired structures on flexible substrate 620.

Once the modifier coating(s) are formed, flexible substrate 620 travels through a post-coating module 650, where a semiconductor region is printed, as described with respect to FIGS. 2D-2E or FIGS. 4D-4E. Any other required transistor or interconnect elements are also formed by post-coating module 650 (e.g., dielectric 420 and gate contact 430 described with respect to FIGS. 4F and 4G) to form completed printed ICs on flexible substrate 620.

Flexible substrate 620 is then fed into separator 660, which cuts flexible substrate 620 into discrete flexible circuits 680, which can then be transported to test, packaging, and/or any other destination by transport system 670. Flexible circuits 680 can comprise any type of circuit that can be produced using the IC printing technique described with respect to FIG. 5. For example, according to an embodiment of the invention, flexible circuits 680 could comprise large TFT arrays forming a display. Such displays could be produced relatively inexpensively by the (non-chamber-based) continuous roll-process as electronic newspapers or magazines. Although the present invention has been described in connection with several embodiments, it is understood that this invention is not limited to the embodiments disclosed, but is capable of various modifications that would be apparent to one of ordinary skill in the art. Therefore, the invention is limited only by the following claims.

The invention claimed is:

1. A method for producing a transistor, the method comprising:
   forming a contact pair on a base layer, the contact pair including a source contact and a drain contact defining a channel region therebetween;
   creating a receiving surface by forming at least one of a first modifier coating on the base layer in the channel region and a second modifier coating on the contact pair;
   depositing a semiconductor printing fluid onto the receiving surface, the receiving surface being formed by one of the first modifier coating and the base layer and one of the second modifier coating and the contact pair, wherein the at least one of the first modifier coating and the second modifier coating are selected such that the receiving surface has a predetermined surface energy distribution; and
   allowing the semiconductor printing fluid to dry to form a semiconductor region extending over the channel region, a portion of the source contact, and a portion of the drain contact.

2. The method of claim 1, wherein the receiving surface includes the second modifier coating, the second modifier coating having a first predetermined surface energy, and
   wherein the first predetermined surface energy is less than or equal to a surface energy of the base layer.

3. The method of claim 1, wherein forming the at least one of the first modifier coating and the second modifier coating comprises applying a modifier fluid to the base layer and the contact pair using one of a dip and a spray process,
   wherein the base layer is formed from a first material and the contact pair is formed from a second material, and
   wherein the modifier fluid is reactive with only one of the first material and the second material.

4. The method of claim 3, wherein the modifier fluid forms a monolayer with the source contact and the drain contact to form the second modifier coating.

5. The method of claim 1, wherein the receiving surface includes the first modifier coating and the second modifier coating, the first modifier coating having a first predetermined surface energy and the second modifier coating having a second predetermined surface energy, the first predetermined surface energy being greater than or equal to the second predetermined surface energy.

6. The method of claim 1, wherein forming the contact pair comprises printing the source contact and the drain contact on the base layer.

7. The method of claim 1, further comprising:
forming a gate contact on a substrate; and
forming the base layer over the gate contact,
wherein the base layer comprises a dielectric, and
wherein the channel region is defined over the gate contact.

8. The method of claim 1, further comprising:
forming a dielectric layer over the semiconductor region; and
forming a gate contact on the dielectric layer over the channel region.

9. The method of claim 1, wherein depositing the semiconductor printing fluid comprises jet printing the semiconductor printing fluid onto the receiving surface.

10. A method for creating an array of transistors, the method comprising:
forming a plurality of contact pairs on a base layer, each of the plurality of contact pairs including a source contact and a drain contact defining a channel region therebetween;
forming at least one of a first modifier coating on the base layer in the channel region of each of the plurality of contact pairs and a second modifier coating on each of the plurality of contact pairs to create a receiving surface at each of the plurality of contact pairs, the receiving surface comprising one of the second modifier coating and the contact pair, and one of the first modifier coating and the base layer in the channel region, the first modifier coating and the second modifier coating being selected to create a predetermined surface energy distribution across the receiving surface;
depositing a semiconductor printing fluid onto the receiving surface of each of the plurality of contact pairs; and
allowing the semiconductor printing fluid to dry to form a plurality of semiconductor regions each of the plurality of semiconductor regions making electrical contact with one of the plurality of contact pairs and extending over the channel region defined by the one of the plurality of contact pairs.

11. The method of claim 10, wherein forming the at least one of the first modifier coating on the base layer in the channel region of each of the plurality of contact pairs and the second modifier coating on each of the plurality of contact pairs comprises applying a modifier fluid to the base layer and the plurality of contact pairs using one of a dip and a spray process,
wherein the base layer is formed from a first material and each of the plurality of contact pairs is formed from a second material, and
wherein the modifier fluid is reactive with only one of the first material and the second material.

* * * * *

UNITED STATES PATENT AND TRADEMARK OFFICE
CERTIFICATE OF CORRECTION

PATENT NO. : 7,361,529 B2  
APPLICATION NO. : 11/332577  
DATED : April 22, 2008  
INVENTOR(S) : Michael L. Chabinyc et al.

Page 1 of 1

It is certified that error appears in the above-identified patent and that said Letters Patent is hereby corrected as shown below:

In the Specification:

Column 1, line 12, please delete "70NANBOH3033" and insert --70NANB0H3033--.

Signed and Sealed this
Third Day of September, 2013

Teresa Stanek Rea
*Acting Director of the United States Patent and Trademark Office*